United States Patent
Muto et al.

(10) Patent No.: US 6,836,006 B2
(45) Date of Patent: Dec. 28, 2004

(54) SEMICONDUCTOR MODULE

(75) Inventors: Hirotaka Muto, Tokyo (JP); Takeshi Ohi, Tokyo (JP); Takumi Kikuchi, Tokyo (JP); Toshiyuki Kikunaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 9 days.

(21) Appl. No.: 09/447,945

(22) Filed: Nov. 29, 1999

(65) Prior Publication Data

US 2002/0043708 A1 Apr. 18, 2002

(30) Foreign Application Priority Data

Nov. 30, 1998 (JP) ............................ P10-339543

(51) Int. Cl.[7] .................. H01L 23/02; H01L 23/48; H01L 23/52
(52) U.S. Cl. ............... 257/686; 257/777; 257/723; 257/712; 257/706; 257/691; 257/784; 257/785
(58) Field of Search .................... 257/686, 777, 257/706, 712, 723, 691, 735, 784, 785, 727

(56) References Cited

U.S. PATENT DOCUMENTS

| | | | | |
|---|---|---|---|---|
| 4,122,479 A | * | 10/1978 | Sugawara et al. | ............ 357/19 |
| 4,963,976 A | * | 10/1990 | Fluegel et al. | ................ 357/82 |
| 5,545,465 A | * | 8/1996 | Gaynes et al. | .............. 428/209 |
| 5,574,312 A | | 11/1996 | Bayerer et al. | |
| 5,786,636 A | * | 7/1998 | Takahashi | ................... 257/723 |
| 5,942,797 A | * | 8/1999 | Terasawa | ..................... 257/723 |
| 6,075,279 A | * | 6/2000 | Andoh | ........................ 257/620 |
| 6,081,039 A | * | 6/2000 | Furnival | ..................... 257/785 |
| 6,133,626 A | * | 10/2000 | Hawke et al. | ............. 257/686 |
| 6,201,701 B1 | * | 3/2001 | Linden et al. | .............. 361/720 |
| 6,586,835 B1 | * | 7/2003 | Ahn et al. | ................... 257/717 |

FOREIGN PATENT DOCUMENTS

EP      0 868 013      9/1998

* cited by examiner

Primary Examiner—Steven Locke
Assistant Examiner—Nitin Parekh
(74) Attorney, Agent, or Firm—Oblon, Spivak, McClelland, Maier & Neustadt, P.C.

(57) ABSTRACT

In an IGBT module which contains an IGBT device and a diode device connected to each other and accommodated in a case and which radiates heat generated in operation through a radiation board, an object is to reduce the area of the module in the lateral direction to achieve size reduction. The collector electrode surface of an IGBT device is provided on a radiation board, and an element connecting conductor is bonded with conductive resin on the emitter electrode surface. The anode electrode surface of a diode device is bonded on it with the conductive resin. The IGBT device and the diode device are thus stacked and connected in the vertical direction.

8 Claims, 8 Drawing Sheets

SEMICONDUCTOR MODULE

BACKGROUND OF THE INVENTION

1. Field of the Invention

The present invention relates to semiconductor modules used in power conversion devices such as inverters and converters, and particularly to the arrangement of semiconductor devices in the module.

2. Description of the Background Art

The semiconductor modules used in power conversion devices such as inverters and converters include MOSFET modules containing a plurality of MOSFET (Metal Oxide Semiconductor Field Effect Transistor) devices, diode modules containing a plurality of diode devices, and IGBT modules containing a plurality of IGBT (Insulated Gate Bipolar Transistor) devices and diode devices, for example. IGBT modules containing a plurality of semiconductor devices, IGBT devices and diode devices, connected in parallel will be described herein as an example of the semiconductor module.

The conventional IGBT modules include that described in "A Novel Low-Cost and High-Reliability IGBT Module for General Use," written by E.Tamba, M.Sasaki, S.Sekine, Y.Sonobe, K.Suzuki, K.Yamada, R.Saito, T.Terasaki, O.Suzuki, T.Shigemura et al. European Conference on Power Electronics and Applications 1997, Trondheim, for example. FIG. 8 is a plane view mainly showing the semiconductor device area in this conventional IGBT module and FIG. 9 is a sectional view mainly showing an area including an IGBT device and a diode device in the module.

In FIGS. 8 and 9, the conventional semiconductor module includes a radiation board 1 made of metal, e.g. copper, for cooling the semiconductor devices, insulating substrates 2 made of aluminum nitride or the like and bonded on the radiation board 1, electrode patterns 2a bonded on both sides of the insulating substrates 2, and IGBT devices 3 and diode devices 4 as semiconductor devices bonded on the metal patterns 2a on the insulating substrates 2. Each IGBT device 3 has an emitter electrode 5 and a gate electrode 6 formed on its one side and a collector electrode 7 formed on the entire surface on the other side, and each diode device 4 has an anode electrode 8 formed on its one side and a cathode electrode 9 formed on the entire surface on the other side thereof. Emitter relay substrates 10, collector relay substrates 11, and gate interconnection substrates 12 are bonded on the radiation board 1, and electrode patterns 10a, 11a, and 12a are respectively bonded on both sides of the substrates.

It also includes aluminum wires 13a, 13b, 13c as interconnections, a module emitter electrode 14, a module collector electrode 15, and module gate electrodes 16 as external terminals, a case 17 made of a resin material and fixed on the radiation board 1, and resin 18 sealing the inside of the case 17.

As shown in FIGS. 8 and 9, the insulating substrates 2 are bonded with solder on the radiation board 1 and the IGBT devices 3 and the diode devices 4 are bonded side by side with solder on the electrode patterns 2a on the insulating substrates 2. Each emitter electrode 5 on the surface of the IGBT device 3 and the anode electrode 8 on the surface of the diode device 4 are connected through the aluminum wires 13a, which are further connected to the electrode pattern 10a on the emitter relay substrate 10.

The electrode pattern 2a on the insulating substrate 2, to which the IGBT device 3 and the diode device 4 are bonded, is connected to the electrode pattern 11a on the collector relay substrate 11 through the aluminum wires 13b, so as to connect the collector electrode 7 on the back of the IGBT device 3, the cathode electrode 9 on the back of the diode device 4, and the electrode pattern 11a on the collector relay substrate 11.

In this way, this semiconductor module contains four IGBT devices 3 and four diode devices 4, where the IGBT devices 3 and the diode devices 4 are connected in inverse parallel. That is to say, the devices are connected to form one module in such a manner that the emitter electrode 5 of the IGBT device 3 and the anode electrode 8 of the diode device 4 are at the same potential and the collector electrode 7 of the IGBT device 3 and the cathode electrode 9 of the diode device 4 are at the same potential.

The module emitter electrode 14 as an external emitter terminal is connected to the electrode patterns 10a on the emitter relay substrates 10, and the module collector electrode 15 as an external collector terminal is connected to the electrode patterns 11a on the collector relay substrates 11. These external terminals 14 and 15 make connections to other semiconductor modules and the like (not shown) outside the case 17 to form a circuit like an inverter. The gate electrode 6 of each IGBT device 3 is connected to the electrode pattern 12a on the gate interconnection substrate 12 through the aluminum wire 13c to control the gate potential for turning on/off the IGBT device 3, and the electrode pattern 12a is further connected to the module gate electrode 16 serving as an external gate terminal.

FIG. 10 shows a circuit diagram of a three-phase inverter circuit as a typical example of a circuit to which the IGBT module is applied. FIG. 10 shows IGBT modules 19 on the positive side, IGBT modules 20 on the negative side, a positive terminal 21 of DC voltage source, a negative terminal 22 of DC voltage source, a collector terminal 23 of the positive-side IGBT module 19 in the U phase, and an emitter terminal 24 of the negative-side IGBT module 20. The connection point 25 between the emitter terminal of the positive-side IGBT module 19 and the collector terminal of the negative-side IGBT module 20 is a U-phase output terminal.

The power conversion devices like inverters using the semiconductor modules are used as motor driving power source in trains, for example, which are usually installed in limited space. Therefore size reduction is extremely important.

In the conventional IGBT module constructed as described above, the semiconductor devices in the IGBT module, or the IGBT device 3 and the diode device 4, are provided side by side in the lateral direction on the radiation board 1 with the insulating substrate 2 therebetween so that the heat generated in operation can be conducted to the radiation board 1 for cooling. The emitter electrode 5 and the anode electrode 8 formed on the surfaces of the devices 3 and 4 are connected by wire bonding through the aluminum wires 13a.

Accordingly, the area reduction of the IGBT module in the plane direction (the direction in which the semiconductor devices 3 and 4 are arranged) is limited, which hinders effective size reduction of the IGBT module.

SUMMARY OF THE INVENTION

According to a first aspect of the present invention, a semiconductor module comprises: a first semiconductor device; a second semiconductor device; and a case for accommodating the first and second semiconductor devices, wherein the first and second semiconductor devices have their respective main electrodes, and the first and second semiconductor devices are stacked, with an element connecting conductor interposed between the main electrodes.

Preferably, according to a second aspect, in the semiconductor module, the first and second semiconductor devices are stacked, with their respective main electrodes facing each other.

Preferably, according to a third aspect, in the semiconductor module, the first and second semiconductor devices are the same kind of semiconductor devices.

Preferably, according to a fourth aspect, in the semiconductor module, the main electrodes of the first and second semiconductor devices are main electrodes having the same function.

Preferably, according to a fifth aspect, in the semiconductor module, the main electrodes of the first and second semiconductor devices are main electrodes having opposite functions.

Preferably, according to a sixth aspect, in the semiconductor module, the first semiconductor device is an IGBT device, the second semiconductor device is a diode device, the semiconductor module further comprises a radiation board on which the IGBT device is provided, and the diode device is provided right above the IGBT device.

Preferably, according to a seventh aspect, in the semiconductor module, the first and second semiconductor devices and the element connecting conductor are bonded together with a conductive resin.

Preferably, according to an eighth aspect, the semiconductor module further comprises a pressurizing mechanism for pressurizing the first and second semiconductor devices from outside in directions in which the main electrodes of the first and second semiconductor devices face each other, and the first and second semiconductor devices are joined together by pressure connection with the element connecting conductor interposed therebetween.

Preferably, according to a ninth aspect, in the semiconductor module, the case comprises two conductive radiation boards, the first and second semiconductor devices stacked with the element connecting conductor interposed therebetween are provided between the two conductive radiation boards, and the pressurizing mechanism pressurizes the two conductive radiation boards in the facing directions.

As stated above, according to the semiconductor module of the first aspect of the present invention, the first semiconductor device and the second semiconductor device are stacked and connected through an element connecting conductor and accommodated in a case. This reduces the area of the semiconductor module and effectively achieves size reduction.

According to the semiconductor module of the second aspect of the invention, the first and second semiconductor devices are stacked with their respective main electrodes facing each other. This improves the cooling performance of the semiconductor module.

According to the semiconductor module of the third aspect of the invention, the first and second semiconductor devices are the same kind of semiconductor devices. This reduces the area of the semiconductor module by half and achieves further size reduction.

According to the semiconductor module of the fourth aspect of the invention, the respective main electrodes of the first and second semiconductor devices are main electrodes having the same function. Then the electric characteristics of the first semiconductor device and the second semiconductor device can be uniform and stable.

According to the semiconductor module of the fifth aspect of the invention, the respective main electrodes of the first and second semiconductor devices are main electrodes having opposite functions. This effectively achieves the size reduction of the semiconductor module in which semiconductor devices of the same kind are connected in parallel.

According to the semiconductor module of the sixth aspect of the invention, an IGBT device is provided on a radiation board and a diode device is provided right above the IGBT device. This provides a semiconductor module having excellent cooling performance.

According to the semiconductor module of the seventh aspect of the invention, the first and second semiconductor devices and the element connecting conductor are bonded together by a conductive resin. The semiconductor devices can be bonded to the element connecting conductor reliably and easily, which facilitates the process of assembling the semiconductor module.

According to the semiconductor module of the eighth aspect of the invention, the first and second semiconductor devices are joined together by pressure connection with the element connecting conductor interposed therebetween. Thus the semiconductor devices can be easily joined to the element connecting conductor, which simplifies the process of manufacturing the semiconductor module.

According to the semiconductor module of the ninth aspect of the invention, the case has two conductive radiation boards and first and second semiconductor devices stacked with the element connecting conductor interposed therebetween are provided between the two conductive radiation boards. The two conductive radiation boards are pressurized by the pressurizing mechanism in the facing directions. This allows easy and simple manufacture of an effectively downsized semiconductor module having excellent cooling performance.

The present invention has been made to solve the problems above, and an object of the present invention is to provide a module structure which can effectively promote size reduction of a semiconductor module containing a plurality of semiconductor devices connected to realize large-power switching.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
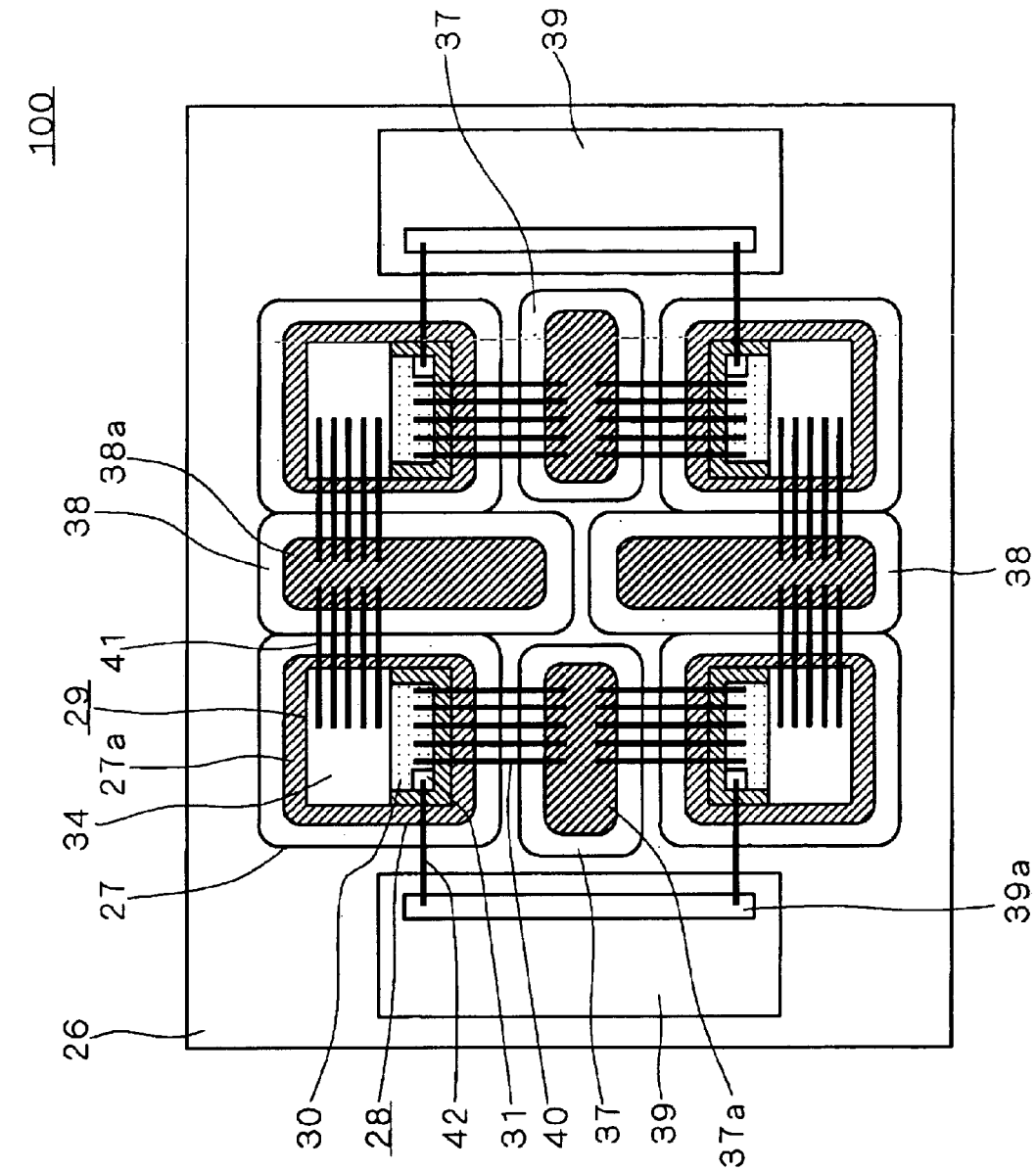
FIG. 1 is a plane view showing the structure of an IGBT module according to a first preferred embodiment of the present invention.

A first preferred embodiment will now be described in detail referring to the drawings.

Figure 2:
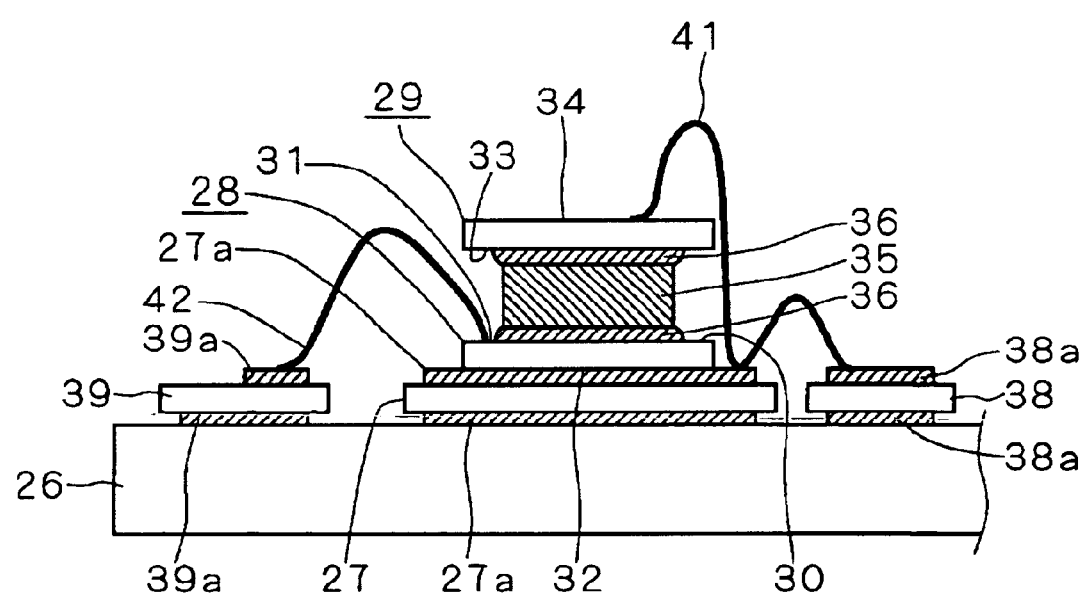
FIG. 2 is a sectional view showing the structure of the IGBT module according to the first preferred embodiment of the present invention.

FIGS. 1 and 2 show the structure of an IGBT module 100 according to the first preferred embodiment of the present invention, where FIG. 1 is a plane view and FIG. 2 is a partial sectional view. This IGBT module contains semiconductor devices in a case; the case is not shown in the diagrams for simplicity.

As shown in FIGS. 1 and 2, the IGBT module 100 has a radiation board 26 made of metal, e.g. copper, for cooling the semiconductor devices, insulating substrates 27 made of aluminum nitride or the like and bonded on the radiation board 26, electrode patterns 27a bonded on both sides of the insulating substrates 27, IGBT devices 28 as first semiconductor devices bonded on the metal patterns 27a on the insulating substrates 27, and diode devices 29 as second semiconductor devices provided over the IGBT devices 28. Each IGBT device 28 has an emitter electrode 30 and a gate electrode 31 formed on its one side and a collector electrode 32 formed on the entire surface on the other side, and each diode device 29 has an anode electrode 33 formed on its one side and a cathode electrode 34 formed on the entire surface on the other side. An element connecting conductor 35 made of metal, e.g. copper, is interposed between the IGBT device 28 and the diode device 29, and conductive resin 36 joins the IGBT device 28 and the diode device 29 to the element connecting conductor 35. Electrode patterns 37a, 38a, and 39a are bonded respectively on both sides of emitter relay substrates 37, collector relay substrates 38, and gate interconnection substrates 39 bonded on the radiation board 26. It also has aluminum wires 40, 41, and 42 as interconnections.

As shown in FIGS. 1 and 2, each insulating substrate 27 is bonded on the radiation board 26 by solder and the surface of the IGBT device 28 on which the collector electrode 32 is formed is bonded by solder on the electrode pattern 27a on the insulating substrate 27. The emitter electrode 30 on the surface of the IGBT device 28 and the element connecting conductor 35, and the element connecting conductor 35 and the anode electrode 33 of the diode device 29, are joined together by the conductive resin 36. Thus the IGBT device 28 and the diode device 29 are stacked and joined in the vertical direction with the element connecting conductor 35 interposed therebetween. The emitter electrode 30 is connected to the electrode pattern 37a on the emitter relay substrate 37 through the aluminum wire 40.

The upper surface of the diode device 29, the electrode pattern 27a on the insulating substrate 27 to which the IGBT device 28 is joined, and the electrode pattern 38a on the collector relay substrate 38 are connected through the aluminum wire 41. Thus the collector electrode 32 on the back of the IGBT device 28, the cathode electrode 34 on the upper surface of the diode device 29, and the electrode pattern 38a on the collector relay substrate 38 are connected to each other.

As described above, this semiconductor module has four IGBT devices 28 and four diode devices 29, where the devices 28 and 29 are stacked, with the emitter electrode 30 of the IGBT device 28 and the anode electrode 33 of the diode device 29 facing each other. The IGBT device 28 and the diode device 29 are connected in inverse parallel. That is to say, the devices are connected to form one module in such a manner that the emitter electrode 30 of the IGBT device 28 and the anode electrode 33 of the diode device 29 are at the same potential and the collector electrode 32 of the IGBT device 28 and the cathode electrode 34 of the diode device 29 are at the same potential.

The gate electrode 31 of the IGBT device 28 is connected to the electrode pattern 39a on the gate interconnection substrate 39 through the aluminum wire 42 to control the gate potential for turning on/off the IGBT device 28. The module thus constructed further comprises a case (not shown) fixed on the radiation board 26 and the module is contained in this case and sealed with resin. The electrode patterns 37a, 38a, and 39a are connected to external module terminals (not shown).

In this preferred embodiment, the area of the module can be reduced by the area approximately equal to the area of the diode device 29, since the diode device 29 is laid over the IGBT device 28, and this preferred embodiment can effectively achieve the size reduction. The emitter electrode 30 of the IGBT device 28 and the anode electrode 33 of the diode device 29 are joined to the element connecting conductor 35 with the conductive resin 36. That is, the IGBT device 28 and the diode device 29 are stacked and joined together through the element connecting conductor 35. The conductive resin 36 is made of epoxy resin with silver filler. It is applied to the surface between two members to be bonded and hardened at a temperature of about 150° C. to keep the bonding strength at the bonded surface.

In the conventional module, the emitter electrode 30 of the IGBT device 28 and the anode electrode 33 of the diode device 29 were electrically connected by wire bonding through the aluminum wire 13a having small sectional area. Connecting them through the element connecting conductor 35 having large sectional area allows the heat generated by the diode device 29 in operation to conduct to the radiation board 26 through the element connecting conductor 35 and the IGBT device 28. Furthermore, in this preferred embodiment, the diode device 29 is laid right above the IGBT device 28, so that a short heat conducting path is formed from the diode device 29 to the radiation board 26 through the element connecting conductor 35 and the IGBT device 28, which reduces the thermal resistance and improves the performance of cooling the diode device 29.

The IGBT device 28 usually generates a greater deal of heat than the diode device 29 when operating. Accordingly when the IGBT device 28 is provided on the radiation board 26 with the insulating substrate 27 interposed therebetween and the diode device 29 is laid further above it with the element connecting conductor 35 therebetween, the heat can be effectively conducted to the radiation board 26 to provide excellent cooling performance.

Furthermore, the conductive resin 36 is not fluidic. Accordingly, when joining the emitter electrode 30 of the IGBT device 28 and the element connecting conductor 35, for example, the conductive resin 36 can be easily applied only to the emitter electrode 30 on the surface of the IGBT device 28. This allows the IGBT device 28 and the element connecting conductor 35 to be joined together without causing short circuit with the gate electrode 31 formed on the same surface. In this way, it is possible to reliably and easily bond the desired electrodes formed on the surfaces of the IGBT device 28 and the diode device 29 to the element connecting conductor 35, which facilitates the assembly process of the module.

Preferably, the element connecting conductor 35 is made of a material having high heat conductivity, and other metals like molybdenum can be used as well as copper. The use of molybdenum can reduce distortion due to thermal stress because its linear expansion coefficient is close to that of silicon used to form the IGBT device 28 and the diode device 29.

The IGBT device 28 and the diode device 29 may be connected to the element connecting conductor 35 with a conductive bond material other than the conductive resin 36. For example, when solder is used to join the emitter electrode 30 of the IGBT device 28 and the element connecting conductor 35, the gate electrode 31 surface is covered by a mask material and the solder is applied only to the emitter electrode 30.

<Second Preferred Embodiment>

Figure 3:
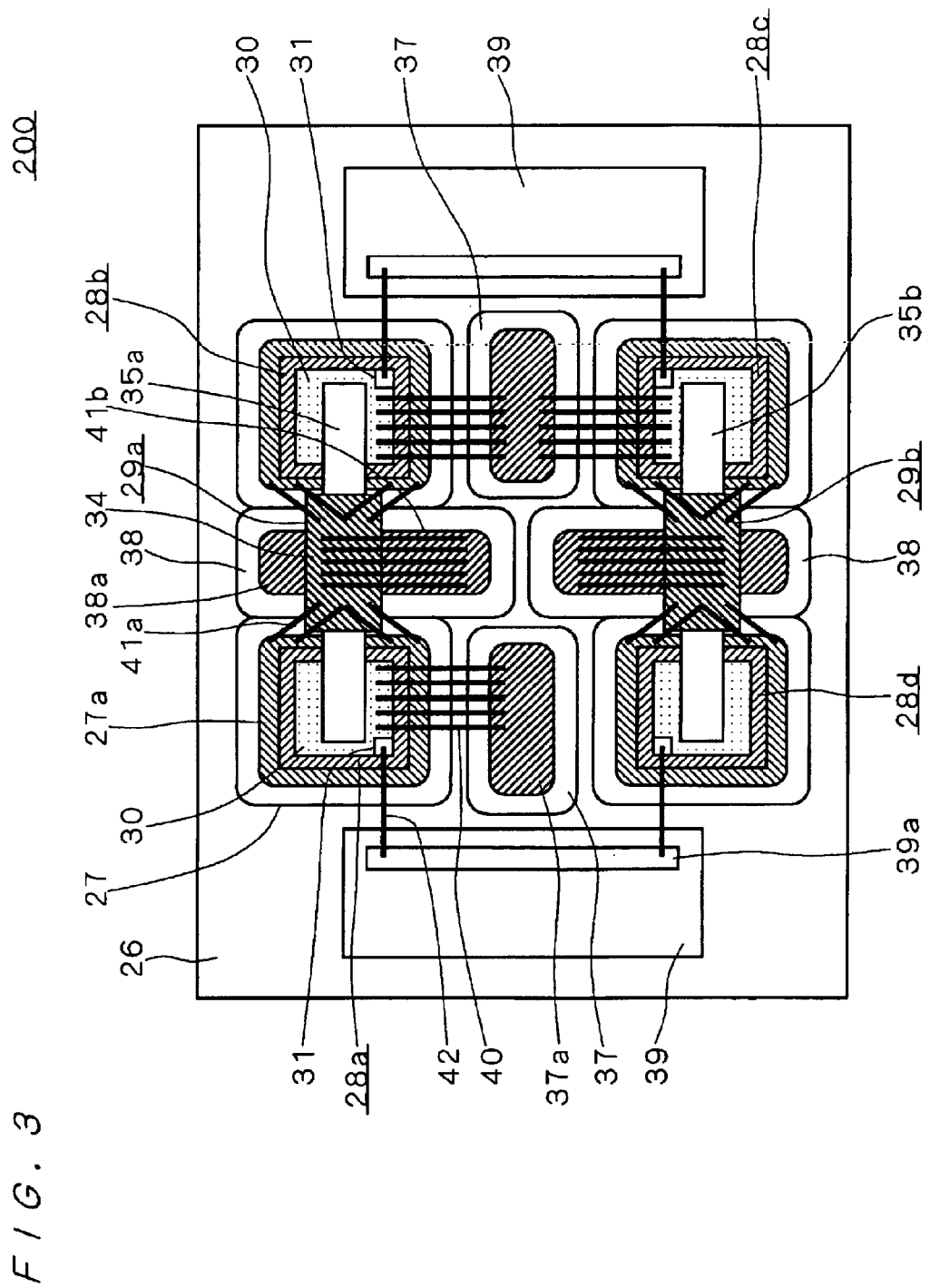
FIG. 3 is a plane view showing the structure of an IGBT module according to a second preferred embodiment of the present invention.

Next, an IGBT module according to a second preferred embodiment of the invention will be described. FIG. 3 is a plane view showing the structure of an IGBT module 200 of the second preferred embodiment.

One diode device 29 is provided for each IGBT device 28 in the examples of modules shown in the first preferred embodiment and the background art. However, the IGBT devices 28 may require a different number of diode devices 29 depending on the current capacity of the diode device 29, and only a single diode device 29 may be required for two IGBT devices 28. This preferred embodiment shows an example in which one diode device 29 is provided for every two IGBT devices 28.

As shown in the diagram, the module contains four IGBT devices 28a, 28b, 28c, and 28d as first semiconductor devices and two diode devices 29a and 29b as second semiconductor devices. The surfaces of the two IGBT devices 28a and 28b (or 28c and 28d) on which the collector electrodes 32 are formed are provided on the radiation board 26 with the insulating substrates 27 interposed therebetween. An element connecting conductor 35a (or 35b) is bonded on their emitter electrode 30 surfaces and the anode electrode 33 of the diode device 29a (or 29b) is bonded on the upper surface of the element connecting conductor 35a (or 35b). The entire structure is accommodated in a case not shown.

In this way, the IGBT devices 28a and 28b (or 28c and 28d) and the diode device 29a (or 29b) are stacked and joined together in the vertical direction with the element connecting conductor 35a (or 35b) interposed therebetween. The emitter electrode 30 is connected to the electrode pattern 37a on the emitter relay substrate 37 through the aluminum wires 40.

The upper surface of the diode device 29a (or 29b) is connected to the electrode patterns 27a on the insulating substrates 27 to which the IGBT devices 28a and 28b (or 28c and 28d) are joined and also to the electrode pattern 38a on the collector relay substrate 38 respectively through the aluminum wires 41a and 41b. The collector electrodes 32 on the back of the IGBT devices 28a and 28b (or 28c and 28d), the cathode electrode 34 on the upper surface of the diode device 29a (or 29b), and the electrode pattern 38a on the collector relay substrate 38 are thus connected to each other.

Also in this preferred embodiment, the diode device 29a (or 29b) is stacked over the IGBT devices 28a and 28b (or 28c and 28d), so that the area of the module can be reduced approximately by the area of the diode devices 29a and 29b. Thus the module can be downsized effectively. The heat generated by the diode device 29a (or 29b) in operation can be conducted to the radiation board 26 through the element connecting conductor 35a (or 35b) and the IGBT devices 28a and 28b (or 28c and 28d).

<Third Preferred Embodiment>

Figure 4:
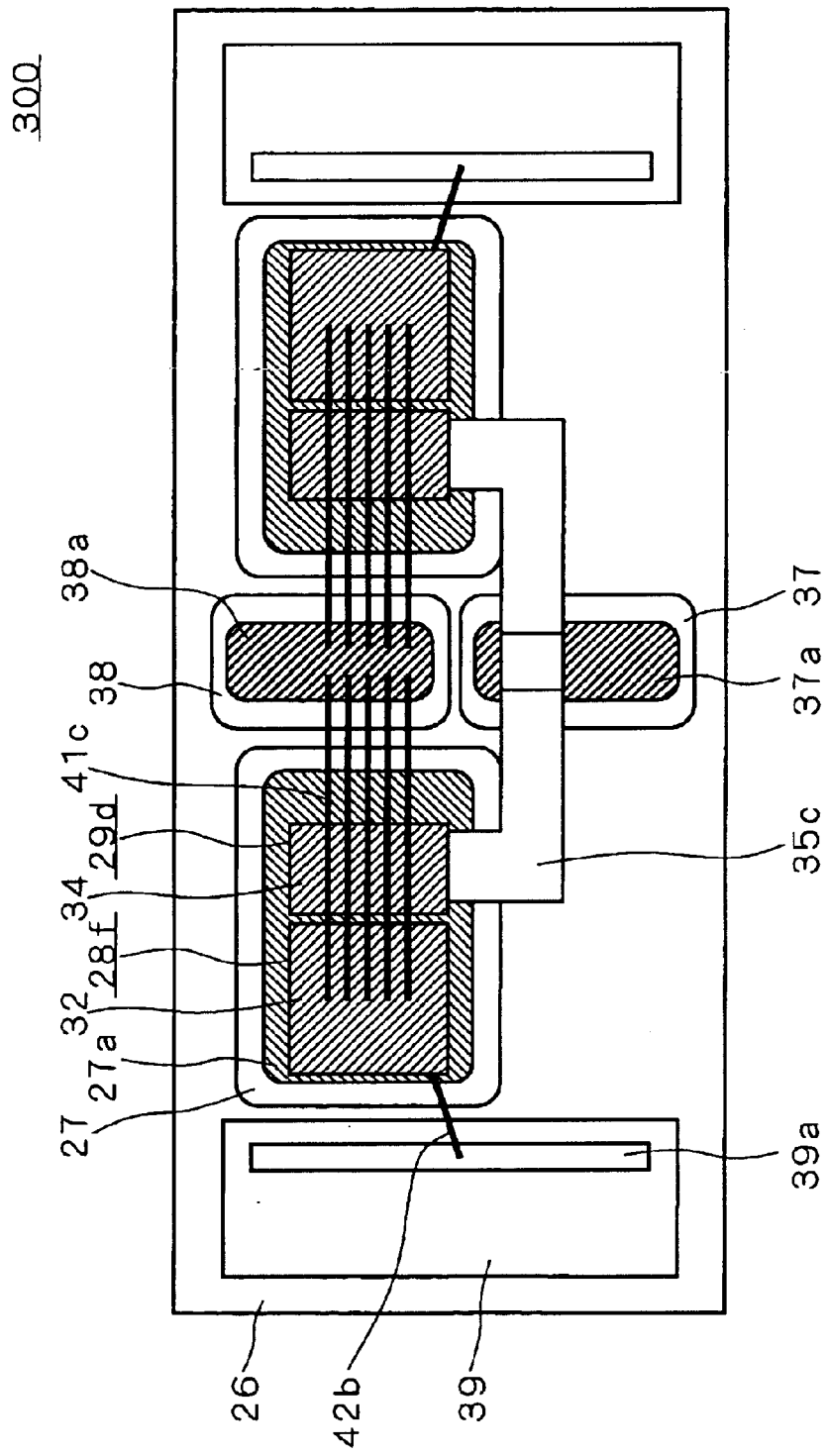
FIG. 4 is a plane view showing the structure of an IGBT module according to a third preferred embodiment of the present invention.
Figure 5:
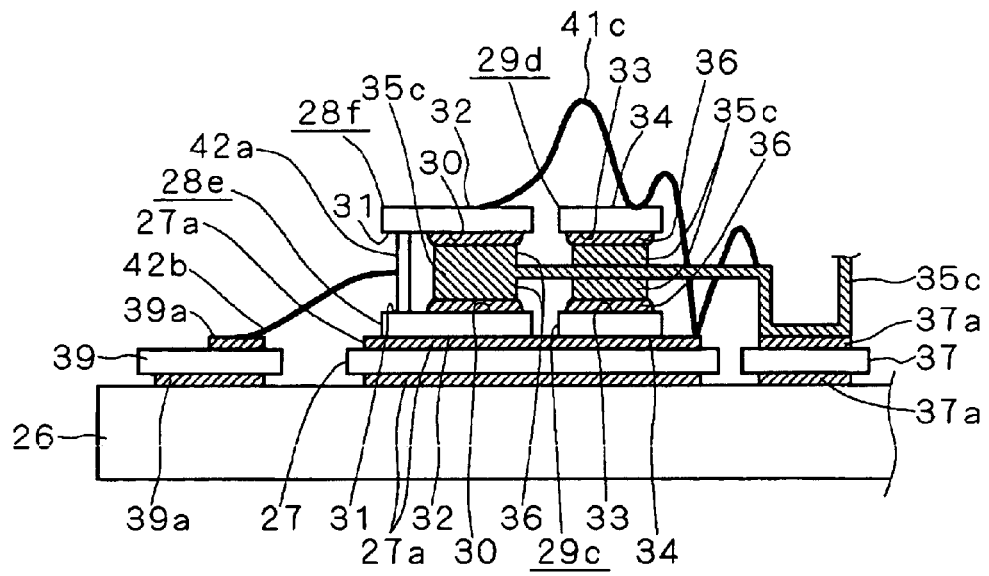
FIG. 5 is a sectional view showing the structure of the IGBT module according to the third preferred embodiment of the present invention.

Next, an IGBT module according to a third preferred embodiment of the present invention will be described. FIGS. 4 and 5 show the structure of an IGBT module 300 of the third preferred embodiment, where FIG. 4 is a plane view and FIG. 5 is a partial sectional view thereof.

As shown in FIGS. 4 and 5, an IGBT device 28e as the first semiconductor device is provided on the radiation board 26 with the insulating substrate 27 interposed therebetween, and an element connecting conductor 35c is bonded on its surface on which the emitter electrode 30 is formed. Bonded on the element connecting conductor 35c is the emitter electrode 30 surface of an IGBT device 28f provided as the second semiconductor device. That is to say, the two IGBT devices 28e and 28f are stacked and joined together in the vertical direction, with their emitter electrode 30 surfaces facing to each other through the element connecting conductor 35c. Similarly, a diode device 29c as the first semiconductor device is provided on the radiation board 26 with the insulating substrate 27 interposed therebetween, and the anode electrode 33 surface of a diode device 29d as the second semiconductor device is provided over the anode electrode 33 surface of the diode device 29c with an element connecting conductor 35c interposed therebetween. These semiconductor devices 28e and 28f, and 29c and 29d are accommodated in a case not shown.

The element connecting conductors 35c joining the two IGBT devices 28e and 28f and the two diode devices 29c and 29d are connected through the plate-like element connecting conductor 35c and also connected to the electrode pattern 37a on the emitter relay substrate 37 through the plate-like element connecting conductor 35c. The collector electrode 32 surface of the IGBT device 28f and the cathode electrode 34 surface of the diode device 29d are joined to the electrode pattern 27a on the insulating substrate 27 through the aluminum wires 41c, and further connected to the electrode pattern 38a on the collector relay substrate 38. The gate electrodes 31 of the IGBT devices 28e and 28f are connected to the electrode pattern 39a on the gate interconnection substrate 39 through the gate pin 42a and the lead 42b.

In this preferred embodiment, the two IGBT devices 28e and 28f, and the two diode devices 29c and 29d, are stacked and joined in the vertical direction with the element connecting conductors 35 interposed therebetween. This structure can reduce the area of the module by half, thus further effectively achieving the size reduction.

The heat generated by the upper device 28f (or 29d) in operation can be conducted to the radiation board 26 through the element connecting connector 35c and the lower device 28e (or 29c).

In the circuit composed of the inverse-parallel connected IGBT devices 28e and 28f and diode devices 29c and 29d, the current flows uniformly in the upper layer including the devices 28f and 29d and in the lower layer including the devices 28e and 29c, which provides a highly reliable module having stable characteristics.

<Fourth Preferred Embodiment>

Figure 6:
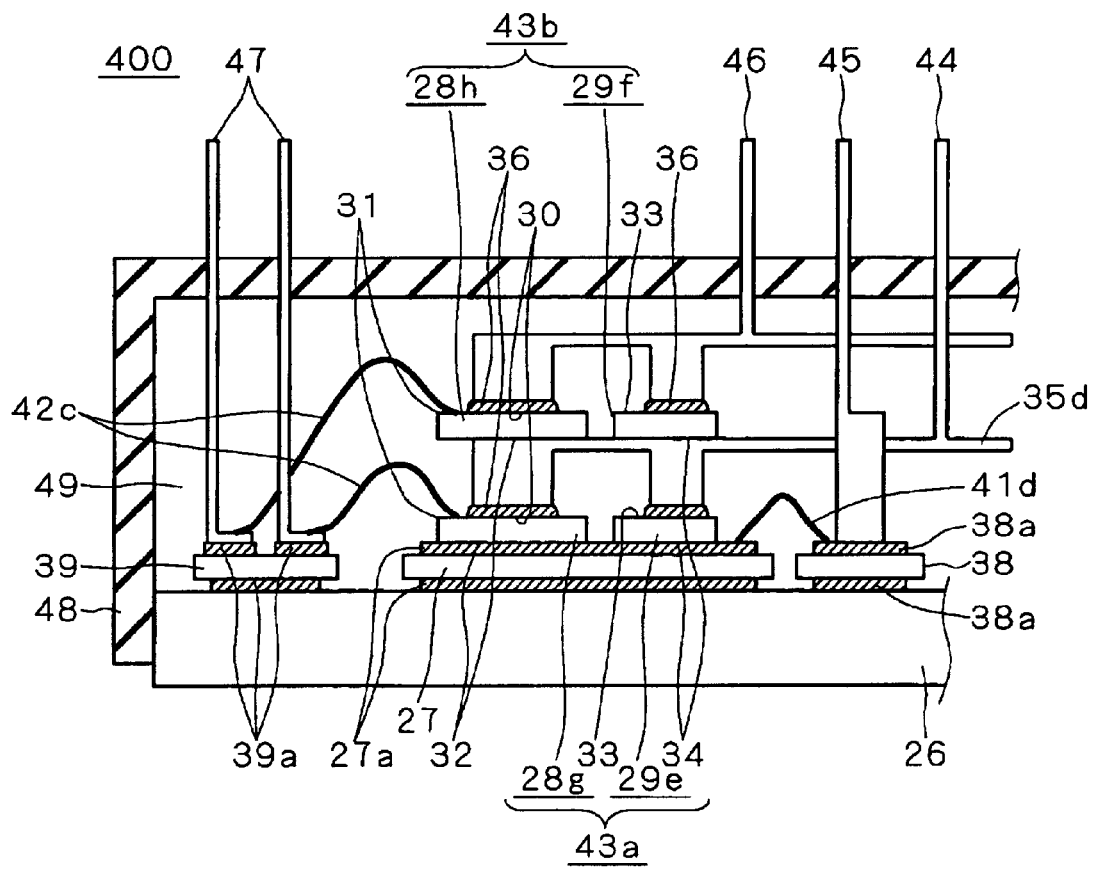
FIG. 6 is a sectional view showing the structure of an IGBT module according to a fourth preferred embodiment of the present invention.

Next, an IGBT module according to a fourth preferred embodiment of the invention will be described. FIG. 6 is a sectional view showing the structure of an IGBT module 400 of the fourth preferred embodiment. This preferred embodiment shows an integrated module in which a positive-side module 43a and a negative-side module 43b are accommodated in one case 48.

As shown in FIG. 6, an IGBT device 28g as the first semiconductor device in the positive-side module 43a and a diode device 29e also as the first semiconductor device are provided on the radiation board 26 with the insulating board 27 interposed therebetween, and an element connecting conductor 35d serving as a CE common electrode is bonded on the emitter electrode 30 surface of the IGBT device 28g and the anode electrode 33 surface of the diode device 29e. The element connecting conductor 35d is a common electrode for the emitter electrode 30 of the positive-side module 43a and the collector electrode 32 of the negative-side module 43b, which is connected to the CE common terminal 44. An IGBT device 28h and a diode device 29f as the second semiconductor devices in the negative-side module 43b are provided on the element connecting conductor 35d, whose collector electrode 32 surface and cathode electrode 34 surface are joined to the element connecting conductor 35d. The integrated module thus constructed is accommodated in the case 48 and sealed with resin 49 like silicone gel.

The module also has a collector terminal 45 for the positive-side module 43a and an emitter terminal 46 for the negative-side module 43b. Gate terminals 47 of the module are connected to the gate electrodes 31 of the positive-side and negative-side modules 43a and 43b through the aluminum wires 42c and the gate interconnection substrate 39.

In this preferred embodiment, the IGBT device 28g and the diode device 29e in the lower layer and the IGBT device 28h and the diode device 29f in the upper layer are stacked and joined with their emitter electrode 30 surfaces and the anode electrode 33 surfaces facing in the same direction (upward). The integrated module containing the positive-side and negative-side modules 43a and 43b thus constructed can be formed in half the area of a conventional integrated module, thus effectively achieving the size reduction.

The heat generated by the upper device 28h (or 29f) in operation can be conducted to the radiation board 26 through the element connecting conductor 35d and the device 28g (or 29e) in the lower layer.

<Fifth Preferred Embodiment>

Figure 7:
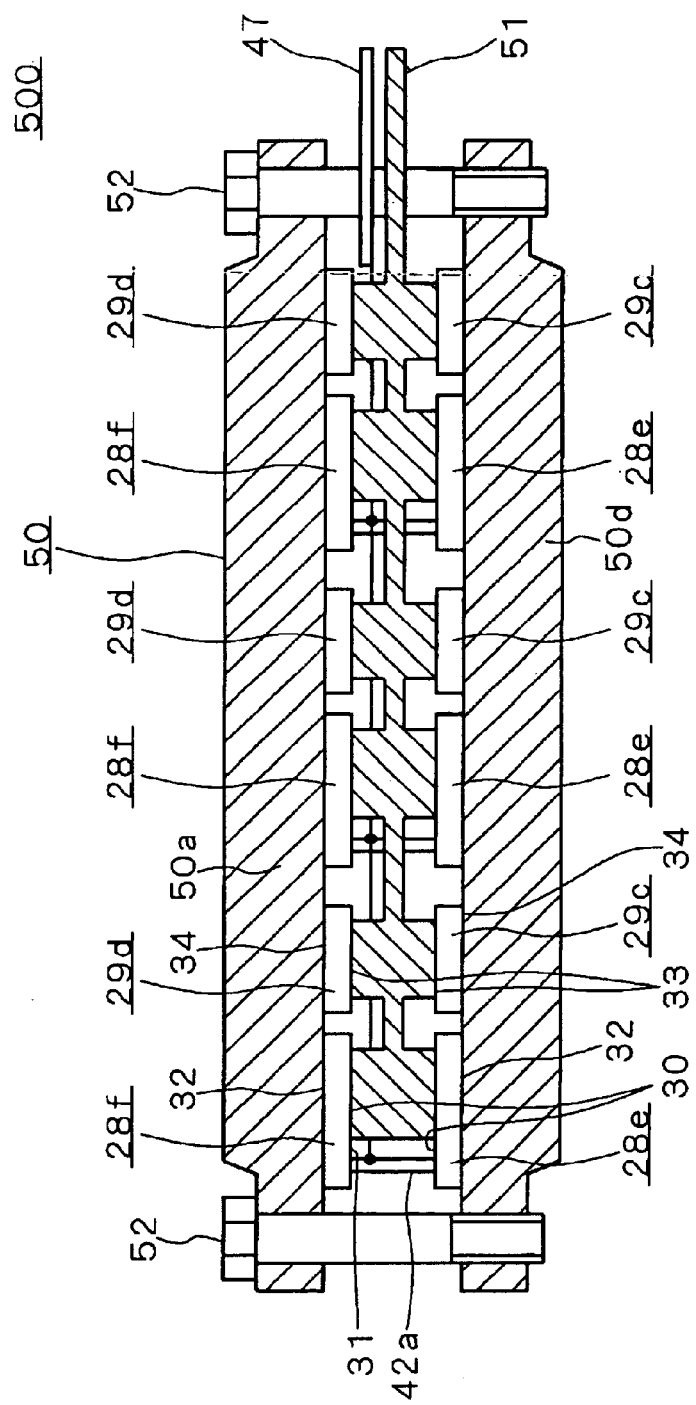
FIG. 7 is a sectional view showing the structure of an IGBT module according to a fifth preferred embodiment of the present invention.
Figure 8:
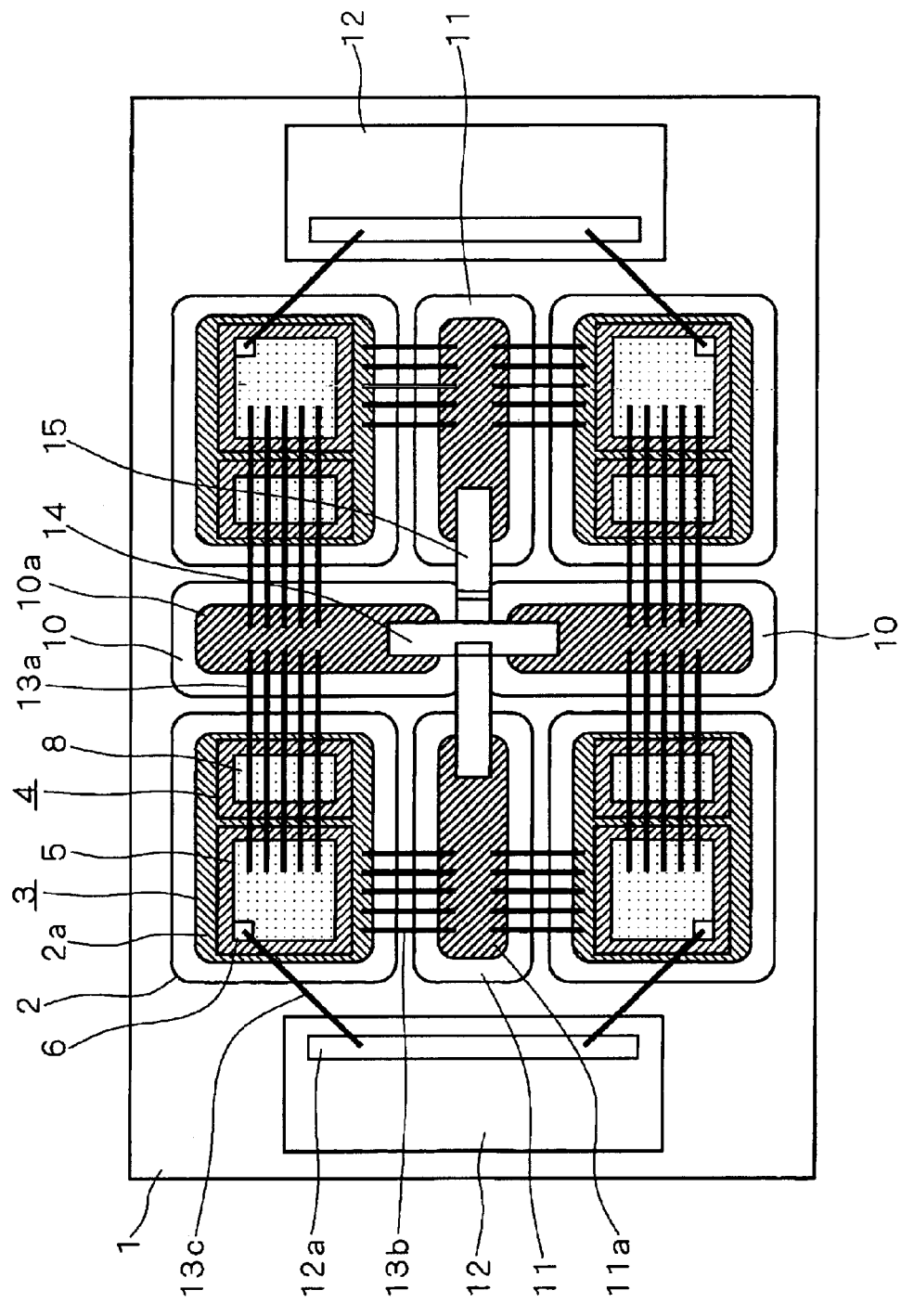
FIG. 8 is a plane view showing the structure of a conventional IGBT module.
Figure 9:
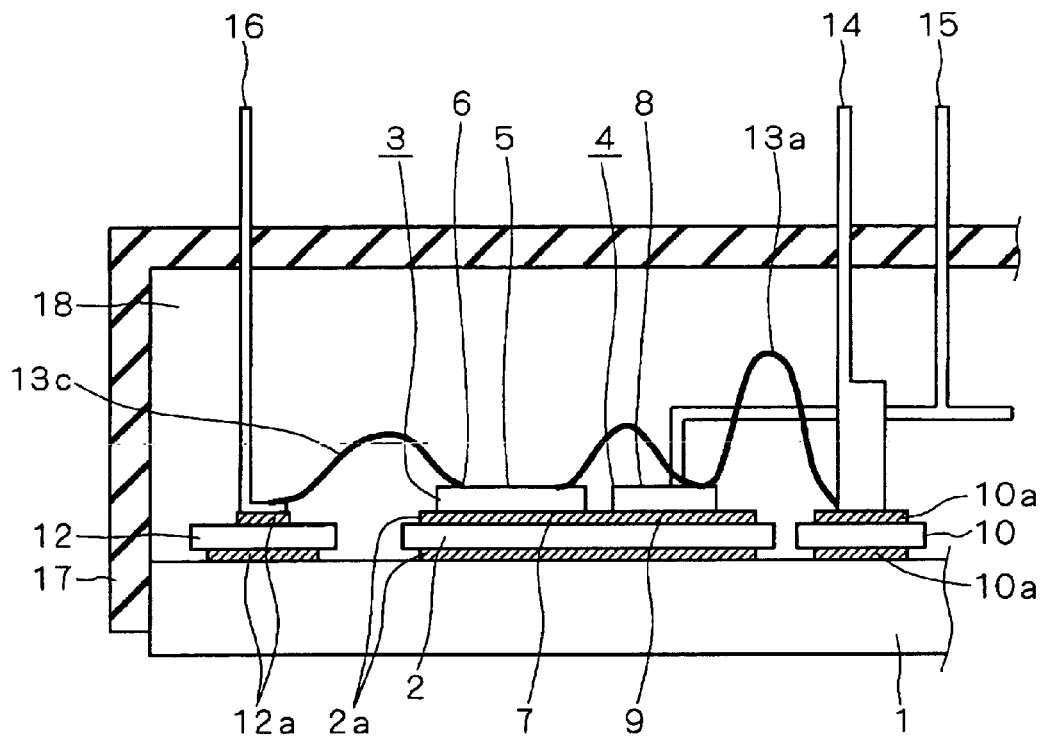
FIG. 9 is a sectional view showing the structure of the conventional IGBT module.
Figure 10:
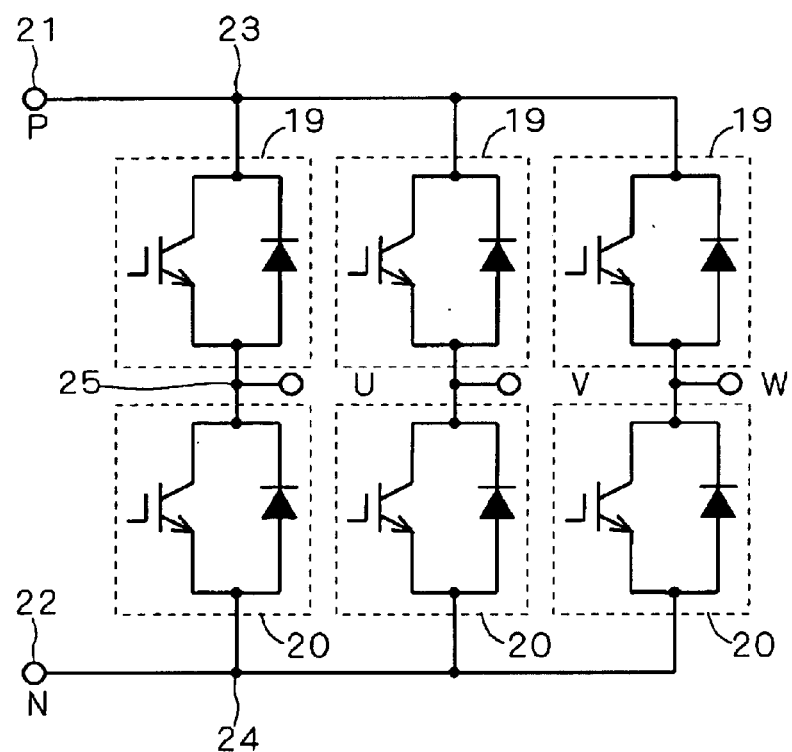
FIG. 10 is a circuit diagram showing an example of circuitry to which the IGBT module is applied.

Next, an IGBT module according to a fifth preferred embodiment of the invention will be described. FIG. 7 is a sectional view showing the structure of an IGBT module 500 of the fifth preferred embodiment.

This preferred embodiment shows an uninsulated type semiconductor module, which has a case 50 composed of conductive radiation boards 50a and 50b serving as collector electrode plates. As shown in the diagram, the case 50 includes the radiation boards 50a and 50b composed of two metal plates. IGBT devices 28e and diode devices 29c as the first semiconductor devices, and IGBT devices 28f and diode devices 29d as the second semiconductor devices, are stacked in such a way that their emitter electrode 30 surfaces and the anode electrode 33 surfaces face to each other through a module emitter electrode 51 as the element connecting conductor. The IGBT devices and the diode devices are arranged between the two radiation boards 50a and 50b, and the radiation boards 50a and 50b pressurize the stacked devices 28e and 28f, and 29c and 29d. Pressurizing bolts 52 are used to pressurize with the radiation boards 50a and 50b. The pressurizing bolts 52 fix the radiation boards 50a and 50b and exert pressure to ensure the electric junction and thermal junction between the devices 28e, 28f, 29c, and 29d and the radiation boards 50a and 50b (the collector electrode plates), and the module emitter electrode 51. The gate electrodes 31 of the IGBT devices 28e and 28f in the module are connected to the gate terminal 47 of the module through gate pins 42a.

In this preferred embodiment, as in the third preferred embodiment, two IGBT devices 28e and 28f, and two diode devices 29c and 29d, are vertically stacked and joined, with the module emitter electrode 51 as the element connecting conductor interposed therebetween. This reduces the area of the module approximately half, thus further effectively achieving the size reduction. Furthermore, the current flows uniformly in the circuit including the upper devices 28f and 29d and in the circuit including the lower devices 28e and 29c, which provides a reliable module with stable characteristics.

Moreover, the module provides remarkable cooling performance since all device 28e, 28f, 29c, and 29d are in contact with the two radiation boards 50a and 50b in their surfaces.

Further, the module emitter electrode 51 and the devices 28e, 28f, 29c, and 29d are joined by using pressurizing force. This eliminates the need of processing with solder or conductive resin and simplifies the manufacturing process.

In this preferred embodiment, the contact between the devices 28e, 28f, 29c, 29d and the radiation boards 50a, 50b is made by mechanical pressure, too. However, the contact surfaces between the radiation boards 50a and 50b and the devices 28e, 28f, 29c, 29d may be bonded together with a conductive bonding material like solder, in which case the bonded surfaces between the module emitter electrode 51 and the devices 28e, 28f, 29c, 29d are bonded with pressure. This simplifies the assembly of the module.

While the invention has been described in detail, the foregoing description is in all aspects illustrative and not restrictive. It is understood that numerous other modifications and variations can be devised without departing from the scope of the invention.

What is claimed is:

1. A semiconductor module comprising:
   a first semiconductor device;
   a second semiconductor device; and
   a case for accommodating said first and second semiconductor devices,
   wherein said first and second semiconductor devices have respective first and second main electrodes, and
   said first and second semiconductor devices are stacked, with an element connecting conductor interposed between said respective first main electrodes;
   said first and second semiconductor devices are the same kind of devices; and
   said first main electrode of said respective first and second semiconductor devices face each other through said element connecting conductor, and said first main electrode of said respective first and second semiconductor devices have the same function.

2. The semiconductor module according to claim 1, wherein said first and second semiconductor devices and said element connecting conductor are bonded together with a conductive resin.

3. The semiconductor module according to claim 1, further comprising a pressurizing mechanism for pressurizing said first and second semiconductor devices from outside in directions in which said first main electrodes of said first and second semiconductor devices face each other, wherein said first and second semiconductor devices are joined together by pressure connection with said element connecting conductor interposed therebetween.

4. The semiconductor module according to claim 1, wherein said element connecting conductor is further connected to an electrode pattern on an emitter relay substrate.

5. A semiconductor module comprising:

a first semiconductor device;

a second semiconductor device; and a case for accommodating said first and second semiconductor devices, wherein said first and second semiconductor devices have respective first and second main electrodes, and said first and second semiconductor devices are stacked, with an element connecting conductor interposed between said respective first main electrodes;

said first and second semiconductor devices are the same kind of devices; and said first main electrode of said respective first and second semiconductor devices face each other through said element connecting conductor, and said first main electrode of said respective first and second semiconductor devices are both emitter electrodes.

6. The semiconductor module according to claim 5, wherein said first and second semiconductor devices and said element connecting conductor are bonded together with a conductive resin.

7. The semiconductor module according to claim 5, further comprising a pressurizing mechanism for pressurizing said first and second semiconductor devices from outside in directions in which said first main electrodes of said first and second semiconductor devices face each other, wherein said first and second semiconductor devices are joined together by pressure connection with said element connecting conductor interposed there between.

8. The semiconductor module according to claim 5, wherein said element connecting conductor is further connected to an electrode pattern on an emitter relay substrate.

* * * * *